United States Patent
Matsuno

(10) Patent No.: US 7,023,072 B2
(45) Date of Patent: Apr. 4, 2006

(54) BIPOLAR TRANSISTOR

(75) Inventor: Noriaki Matsuno, Tokyo (JP)

(73) Assignee: NEC Corporation, Tokyo (JP)

( * ) Notice: Subject to any disclaimer, the term of this patent is extended or adjusted under 35 U.S.C. 154(b) by 144 days.

(21) Appl. No.: 10/469,940

(22) PCT Filed: Mar. 7, 2002

(86) PCT No.: PCT/JP02/02129

§ 371 (c)(1),
(2), (4) Date: Sep. 5, 2003

(87) PCT Pub. No.: WO02/071492

PCT Pub. Date: Sep. 12, 2002

(65) Prior Publication Data

US 2004/0094823 A1 May 20, 2004

(30) Foreign Application Priority Data

Mar. 7, 2001 (JP) .............................. 2001-063330

(51) Int. Cl.
*H01L 27/082* (2006.01)
(52) U.S. Cl. ...................... 257/565; 257/596; 257/607
(58) Field of Classification Search ................ 257/565; 438/322
See application file for complete search history.

(56) References Cited

U.S. PATENT DOCUMENTS 6,552,375 B1 * 4/2003 Swanson et al. ............ 257/198
6,680,234 B1 * 1/2004 Hashimoto .................. 438/309

* cited by examiner

*Primary Examiner*—Thao P. Le
(74) *Attorney, Agent, or Firm*—McGinn IP Law Group, PLLC

(57) ABSTRACT

In a bipolar transistor including a base layer made of SiGe, a non-doped SiGe layer and a non-doped Si layer are provided between the base layer and an emitter layer. The composition ratio of Ge in the emitter side of SiGe base layer is decreased with increasing proximity to the emitter side, and the composition ratio of Ge in the non-doped SiGe layer is made smaller than the composition ratio of Ge at the emitter layer-side end of the SiGe base layer. In this manner, restriction is put on the diffusion of boron from the base layer to the emitter side, and the base-emitter junction capacitance $C_{BE}$ reduced. Furthermore, the direct-current gain β can be improved by increasing the composition of Ge at the emitter end of the SiGe base layer to more than or equal to a predetermined value.

16 Claims, 8 Drawing Sheets

BIPOLAR TRANSISTOR

This application is a 371 of PCT/JP02/02129 filed Mar. 7, 2000.

TECHNICAL FIELD

The present invention relates to a semiconductor device. In particular, the present invention relates to a bipolar transistor including a base layer made of silicon germanium (SiGe).

BACKGROUND ART

A minimum noise figure of a bipolar transistor is effectively reduced by reduction in the base-emitter junction capacitance $C_{BE}$, an improvement in the direct-current gain $\beta$, and/or reduction in the sum, $R_B+R_E$, of a base resistance $R_B$ and an emitter resistance $R_E$.

With respect to a SiGe-base bipolar transistor using SiGe as a base material, since the band gap of SiGe is narrower than the band gap of silicon (Si) or polysilicon (Poly-Si) serving as a material for an emitter, sufficiently large direct-current gain $\beta$ can be achieved by increasing the impurity concentration of the base, and therefore, by reducing the base resistance $R_E$. With respect to the SiGe-base bipolar transistor, the composition ratio of Ge in the base is increased in a direction from the emitter side toward a collector side, and thereby, the base-emitter junction capacitance $C_{BE}$ can be reduced. Consequently, a minimum noise figure of the SiGe-base bipolar transistor can be reduced compared with that of the conventional Si homo-junction bipolar transistor.

With respect to the SiGe-base bipolar transistor, the profile of the composition ratio of Ge has significant effect on the minimum noise figure. FIGS. 1 to 3 show examples of the profiles (the distributions of the composition ratio of Ge and the impurity concentration in the depth direction) in the vicinity of the bases of three SiGe-base bipolar transistors prepared based on a conventional technology. In these drawings, each of first solid lines 10, 20 and 30 indicates a concentration of arsenic (As), while arsenic is a dopant in an n-type emitter. Each of second solid lines 11, 21 and 31 indicates a concentration of boron (B), while boron is a dopant in a p-type base. Each of third solid lines 12, 22 and 32 indicates a concentration of phosphorus (P), while phosphorus is a dopant in an n-type collector. Bach of broken lines 13, 23 and 33 indicates a composition ratio (concentration) of germanium Ge. Each of first double-headed arrows 14, 24 and 34 indicates an emitter poly-Si region. Each of second double-headed arrows 15, 25 and 35 indicates a single crystal Si region. The single crystal Si region is of the p-type in an As-depo state (a state immediately after deposition), and finally becomes of the n-type because of diffusion of arsenic from the emitter poly-Si region 14, 24 or 34. Each of third double-headed arrows 16, 26 and 36 indicates a SiGe region (base region). Each of fourth double-headed arrows 17, 27 and 37 indicates a single crystal Si region (collector region) to serve an a collector.

In FIGS. 1 to 3, the emitter-base junction is a heterojunction. As shown in FIG. 1, the composition ratio of Ge in the base region 16 is 6% at the emitter-base junction. As shown in FIG. 2, the composition ratio of Ge in the base region 26 is 0% at the emitter-base junction. As shown in FIG. 3, the composition ratio of Ge in the SiGe region 36 is a constant 12%.

The direct-current gain $\beta$ of the SiGe-base bipolar transistor has a dependence on the composition ratio of Ge at the emitter-base junction. That is, the direct-current gain $\beta$ of the SiGe-base bipolar transistor having the profile shown in FIG. 3 is higher than that of the SiGe-base bipolar transistors having the profiles shown in FIGS. 1 and 2. The direct-current gain $\beta$ of the SiGe-base bipolar transistor having the profile shown in FIG. 1 is higher than that of the SiGe-base bipolar transistor having the profile shown in FIG. 2.

On the other hand, with respect to the base-emitter junction capacitance $C_{BE}$ of the SiGe-base bipolar transistor, the capacitance of the SiGe-base bipolar transistor having the profile shown in FIG. 1 or 2 is smaller than that of the SiGe-base bipolar transistor having the profile shown in FIG. 3. In the profile shown in FIG. 1 or 2, the base has a gradient composition ratio of Ge, and in the profile shown in FIG. 3, the base has a constant composition ratio of Ge. The SiGe-base bipolar transistor having the profile shown in FIG. 1 exhibits the base-emitter junction capacitance $C_{BE}$ substantially equal to that of the SiGe-base bipolar transistor having the profile shown in FIG. 2.

An described above, with respect to the minimum noise figure, a smallest value is exhibited by the SiGe-base bipolar transistor having the profile shown in FIG. 1, wherein the compatibility is ensured between a higher direct-current gain $\beta$ and a smaller base-emitter junction capacitance $C_{BE}$.

A method for reducing the base-emitter junction capacitance $C_{BE}$ is known as a technology for further reducing the minimum noise figure of the SiGe-base bipolar transistor. In this method, a non-doped layer is provided between the base and the emitter.

FIG. 4 shows an impurity profile in the vicinity of the base of the SiGe-base bipolar transistor including a non-doped layer between the base and the emitter. In FIG. 4, a first solid line 40 indicates a concentration of arsenic (As), while arsenic is a dopant in an n-type emitter. A second solid line 41 indicates a concentration of boron (B), while boron is a dopant in a p-type base. A third solid line 42 indicates a concentration of phosphorus (P), while phosphorus in a dopant in an n-type collector. A broken line 43 indicates a composition ratio of Ge. A first double-headed arrow 44 indicates an emitter poly-Si region. A second double-headed arrow 45 indicates a single crystal Si region. The single crystal Si region is non-doped in an As-depo state (a state immediately after deposition), and finally a part thereof becomes of the n-type because of diffusion of arsenic from the emitter poly-Si region 44. A third double-headed arrow 46 indicates a SiGe region (base region). A fourth double-headed arrow 47 indicates a single crystal Si region (collector region) to so as a collector.

With respect to the bipolar transistor having the profile shown in FIG. 4, the base-emitter junction capacitance $C_{BE}$ is reduced because the composition ratio of Ge in the emitter-side portion of the base region 46 is decreased with increasing proximity to the emitter region side and the non-doped layer 45 is provided between the emitter region 44 and the base region 46. With respect to this bipolar transistor, the direct-current gain $\beta$ is improved by increasing the composition ratio of Ge to 6% at the emitter region-side end of the base region 46. With respect to this bipolar transistor, reduction in the minimum noise figure is achieved by the reduction in the base-emitter junction capacitance $C_{BE}$ and the improvement in the direct-current gain $\beta$.

When the non-doped layer 45 is provided between the base region 46 and the emitter region 44, the direct-current gain $\beta$ is reduced compared with that in the case where the non-doped layer 45 is not provided (in the case corresponding to FIG. 1). The reduction in the direct-current gain β brings about an increase in the minimum noise figure. However, when the thickness of the non-doped layer 45 is in the order of a few tens of nanometers or less, the influence of the reduction in the base-emitter junction capacitance $C_{BE}$ has the edge over the influence of the reduction in the direct-current gain β, and as a result, the minimum noise figure of the SiGe-base transistor including the non-doped layer 45 becomes smaller than the minimum noise figure of the SiGe-base transistor not including the non-doped layer 45.

In this manner, the SiGe-base bipolar transistor having the profile shown in FIG. 4 exhibits a minimum noise figure smaller than that of the SiGe-base bipolar transistor having the profile shown in FIG. 1.

However, a problem occurs in that manufacture is practically difficult with respect to a device having the profile shown in FIG. 4. This is because boron (indicated by the second solid line 41) diffuses into the emitter region 44 side due to heat history during manufacture of the device, while the boron is to be introduced into the base region 46, and a part of the non-doped layer 45 is converted to a part of the p-type base. That is, when a device is manufactured with the intention to have the profile shown in FIG. 4, the actually prepared device has the profile shown in FIG. 5.

In FIG. 5, a first solid line 50 corresponds to the first solid line 40 shown in FIG. 4, and indicates a concentration of arsenic (As), while arsenic is a dopant in an n-type emitter. A second solid line 51 corresponds to the second solid line 41 shown in FIG. 4, and indicates a concentration of boron (B), while boron is a dopant in a p-type base. A third solid line 52 corresponds to the third solid line 42 shown in FIG. 4, and indicates a concentration of phosphorus (P), while phosphorus in a dopant in an n-type collector. A broken line 53 corresponds to the broken line 43 shown in FIG. 4, and indicates a composition ratio of Ge. A first double-headed arrow 54 corresponds to the first double-headed arrow 44 shown in FIG. 4, and indicates an emitter poly-Si region. A second double-headed arrow 55 corresponds to the second double-headed arrow 45 shown in FIG. 4, and indicates a non-doped single crystal Si region in an As-depo state (a state immediately after deposition). A third double-headed arrow 56 corresponds to the third double-headed arrow 46 shown in FIG. 4, and indicates a SiGe region (base region). A fourth double-headed arrow 57 corresponds to the fourth double-headed arrow 47 shown in FIG. 4, and indicates a single crystal Si region to serve as a collector.

The single crystal Si region 55 is non-doped in an As-depo state (a state immediately after deposition), and partially, the base side and the emitter side are converted to of the p-type and n-type, respectively, due to heat history during manufacture of the device. The base side of the single crystal Si region 55 is partially converted to of the p-type, and thereby, the location of the bases-emitter junction moves in the side nearer to the emitter than the location of the SiGe—Si hetero-interface. As a result, with respect to the bipolar transistor having the profile shown in FIG. 5, the base-emitter junction capacitance $C_{BE}$ increased, the direct-current gain β is reduced, and the minimum noise figure is increased compared with that having the profile shown in FIG. 4. As described above, realization of the structure having the profile shown in FIG. 4 (ideal structure) is difficult, while the structure can ensure the compatibility between a mall base-emitter junction capacitance $C_{BE}$ and a high direct-current gain β.

The present invention was made in consideration of the above-described problems. It is a major abject of the present invention to provide a bipolar transistor having a small minimum noise figure by ensuring the compatibility between a small base-emitter junction capacitance $C_{BE}$ and a high direct-current gain β.

DISCLOSURE OF INVENTION

In the present invention, a non-doped SiGe layer prevents thermal diffusion of impurities in a base layer into an emitter layer side.

According to a first aspect of the present invention, in a bipolar transistor including a SiGe base layer and an emitter layer, a non-doped SiGe layer and a non-doped Si layer are provided between the above-described SiGe base layer and the above-described emitter layer, the non-doped SiGe layer is adjacent to the above-described SiGe base layer, and the non-doped Si layer is adjacent to the non-doped SiGe layer and also is adjacent to the above-described emitter layer.

Here, the composition ratio of Ge in the above-described non-doped SiGe layer is smaller than the composition ratio of Ge in the above-described SiGe base layer. The composition ratio of Ge continuously or stepwise decreases with increasing proximity to the emitter side in at least a part of the emitter side of the above-described SiGe base layer.

According to a second aspect of the present invention, a bipolar transistor has a laminated structure composed of a collector layer, a SiGe base layer, a non-doped SiGe layer, a non-doped Si layer and an emitter layer in that order. The composition ratio of Ge gradually decreases with increasing proximity to the emitter layer side in at least a part of the emitter layer side of the above-described SiGe base layer. The composition ratio of Ge in the above-described non-doped SiGe layer is smaller than the composition ratio of Ge at the emitter layer-side end of the above-described SiGe base layer.

According to the third aspect of the present invention, a bipolar transistor has a laminated structure composed of a collector layer, a SiGe base layer, a non-doped SiGe layer, a non-doped Si layer and an emitter layer in that order. The composition ratio of Ge in the above-described SiGe base layer stepwise decreases with increasing proximity to the emitter layer side in at least a part of the emitter layer side. The composition ratio of Ge in the above-described non-doped SiGe layer is smaller than the composition ratio of Ge at the emitter layer-side end of the above-described SiGe base layer.

In the bipolar transistor according to the above-described first, second or third aspect, preferably, the total film thickness is 5 nm or more, but 60 nm or less with respect to the above-described non-doped SiGe layer and the above-described non-doped Si layer.

In the bipolar transistor according to the above-described first, second or third aspect, the composition ratio of Ge is 3% or more at the emitter layer-side end of the above-described SiGe base layer, and preferably, is 6% or more.

In the bipolar transistor according to the above-described first, second or third aspect, preferably, the composition ratio of Ge at the emitter layer-side end of the above-described SiGe base layer is more than or equal to one-fifth the maximum value of the composition ratio of Ge in the SiGe base layer.

In the bipolar transistor according to the above-described first, second or third aspect, each of the above-described non-doped SiGe layer and the above-described non-doped Si layer is a layer having an impurity concentration of $1 \times 10^{17}$ cm⁻³ or less, or is a layer having an impurity concentration of less than or equal to one-fiftieth the impurity concentration of the above-described SiGe base region.

In the bipolar transistor according to the above-described first, second or third aspect, the above-described non-doped SiGe layer and the above-described non-doped Si layer constitute a space-charge region, and the band gap of the space-charge region i adjusted at a value between the band gap of the above-described emitter layer and the band gap of the above-described SiGe base layer.

The base-emitter junction capacitance $C_{BE}$ takes on a small value because the composition ratio of Ge in the emitter layer side of the SiGe base layer is decreased with increasing proximity to the emitter layer side, and the non-doped layers (the non-doped SiGe layer and the non-doped Si layer) are provided between the emitter layer and the base layer. The direct-current gain β takes on a large value because the composition ratio of Ge is adjusted at a predetermined value or more in the emitter layer-side end of the SiGe base layer. In this manner, with respect to the bipolar transistor according to the present invention, the minimum noise FIG. 48 reduced than ever.

Since the diffusion coefficient of boron in the SiGe crystal is significantly smaller than that in the Si crystal, the diffusion of boron is reduced by extending the non-dope SiGe layer to cover the emitter layer-side end of the SiGe base layer, while boron diffuses from the base layer toward the emitter side due to heat history. Since the composition ratio of Ge in the non-doped SiGe layer is ado smaller than the composition ratio of Ge in the emitter layer-side end of the SiGe base layer, reduction can be achieved with respect to degradation of characteristics due to adoption of the non-doped SiGe layer.

BEST MODE FOR CARRYING OUT THE INVENTION

In order to provide a further understanding of the present invention, preferred examples will be described below in detail with reference to the drawings.

Figure 6:
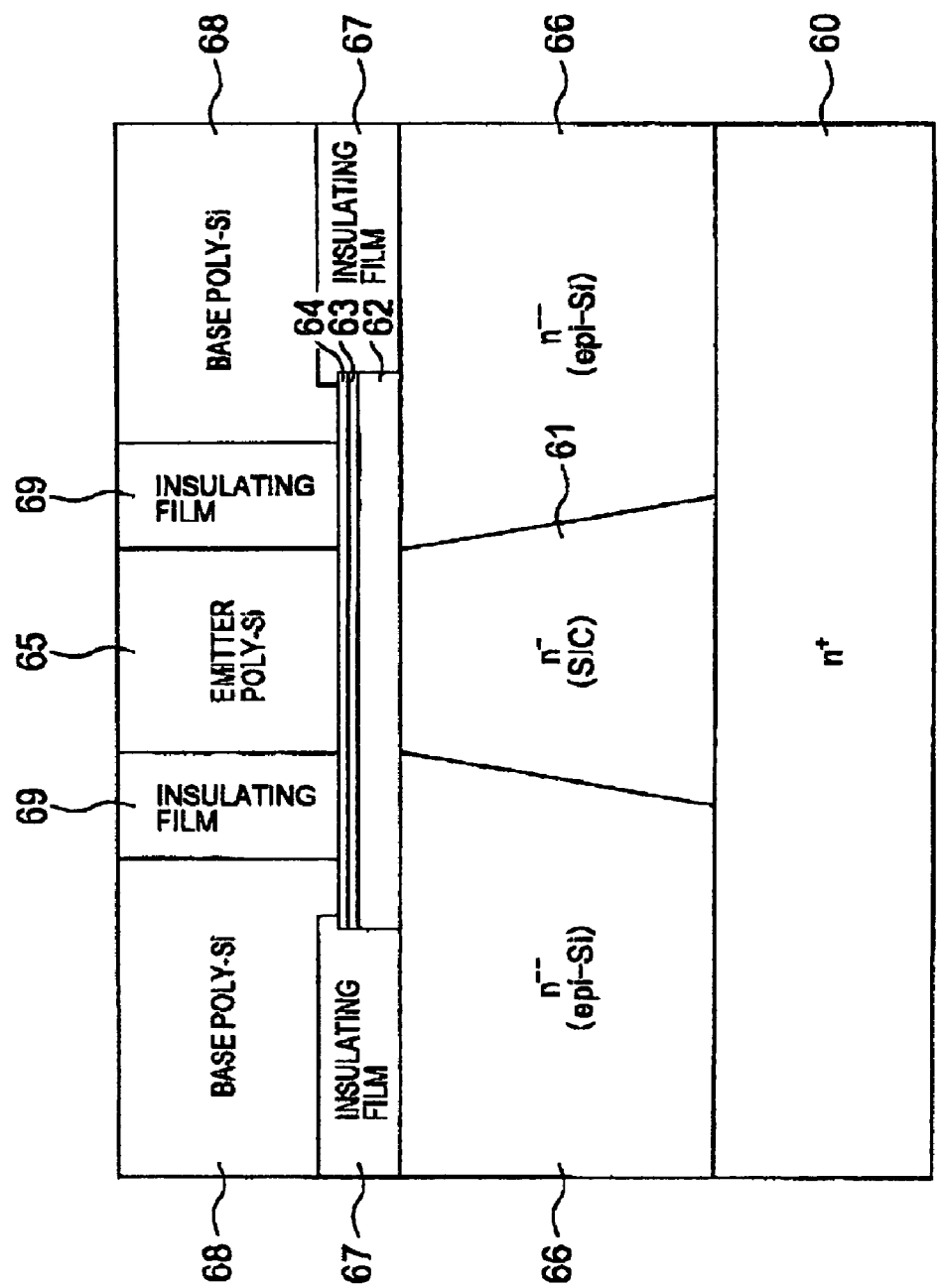
FIG. 6 is a sectional view showing a structure of the principal portion of a bipolar transistor according to an embodiment of the present invention.

FIG. 6 is a schematic, sectional view showing the principle portion of a SiGe-base bipolar transistor according to a preferred example of the present invention. This bipolar transistor has a laminated structure composed of a n⁺-type Si layer 60 to serve as a collector, a single crystal Si layer 61 to also serve as a collector, a SiGe base layer 62, a non-doped SiGe layer 63, a non-doped Si layer 64 and an emitter poly-Si layer 65 in that order. This bipolar transistor includes n⁻⁻-type Si layers 66 on both sides of the single crystal Si layer 61, insulating films 67 on the top surfaces of the n⁻⁻-type Si layers 66, base poly-Si layers 68 provided on the insulating layers 67 while being in contact with the non-doped Si layer 64, and insulating layers 69 separating the emitter poly-Si layer 65 from the base poly-Si layers 68.

The bipolar transistor of the present example is characterized by the non-doped SiGe layer 63. The non-doped SiGe layer 63 as well as the non-doped Si layer 64 are arranged between the base layer 62 and the emitter layer 65 so as to cover the base layer 62.

Figure 7:
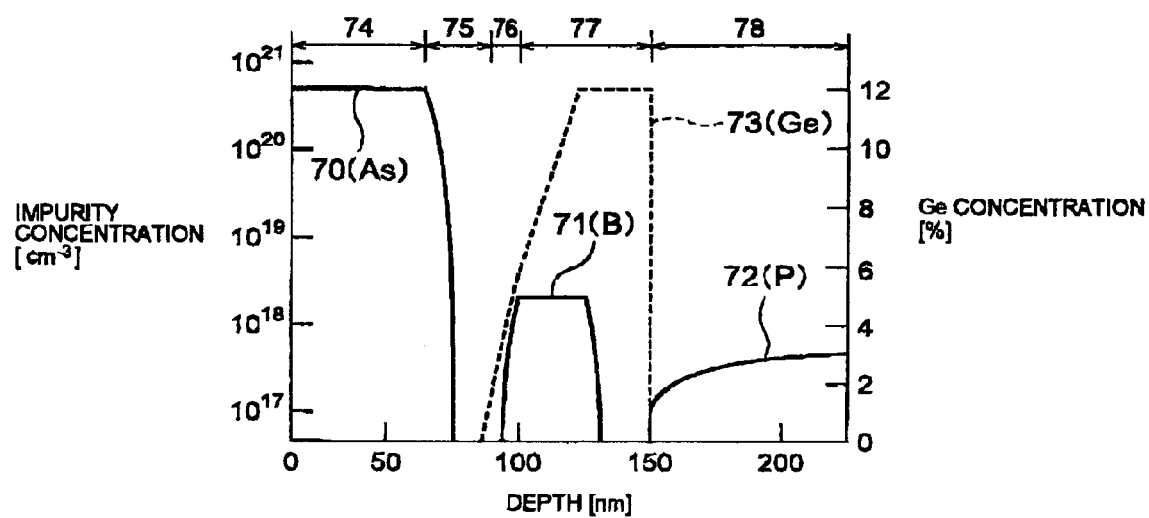
FIG. 7 is a diagram showing the distributions of the impurity concentration and the composition ratio of Ge in the depth direction of the bipolar transistor shown in FIG. 6.

FIG. 7 shows the distributions (profile) of the impurity concentration and the Ge concentration in the depth direction of the bipolar transistor shown in FIG. 6. In FIG. 7, a first solid line 70 indicates a concentration of arsenic (As), while arsenic is a dopant in an n-type emitter. A second solid line 71 indicates a concentration of boron (B), while boron in a dopant in a p-type base. A third solid line 72 indicates a concentration of phosphorus (P), while phosphorus is a dopant in an n-type collector. A broken line 73 indicates a composition ratio (concentration) of Ge. A first double-headed arrow 74 indicates an emitter poly-Si region (the emitter poly-Si region 65 shown in FIG. 6). A second double-headed arrow 75 indicates a single crystal Si region (the non-doped Si layer 64 shown in FIG. 6). The single crystal Si region is non-doped in an As-depo state (a state immediately after deposition), and finally a part thereof becomes of the n-type because of diffusion of arsenic from the emitter poly-Si region 74. A third double-headed arrow 76 indicates a SiGe region (the non-doped SiGe layer 63 shown in FIG. 6). The SiGe region is non-doped in an As-depo state (a state immediately after deposition), and finally a part thereof becomes of the p-type because of diffusion of boron from the bass region 77. A fourth double-headed arrow 77 indicates a SiGe base region (the SiGe base layer 62 shown in FIG. 6). A fifth double-headed arrow indicates a single crystal Si region (the single crystal Si layer 61 shown in FIG. 6) to serve as a collector.

Figure 1:
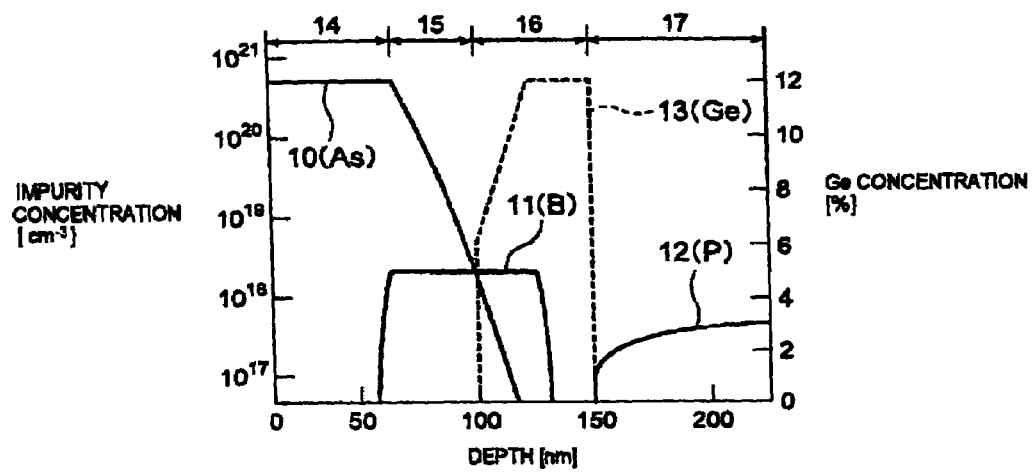
FIG. 1 is a diagram showing the distributions of the impurity concentration and the composition ratio of Ge in the depth direction of a conventional bipolar transistor.
Figure 2:
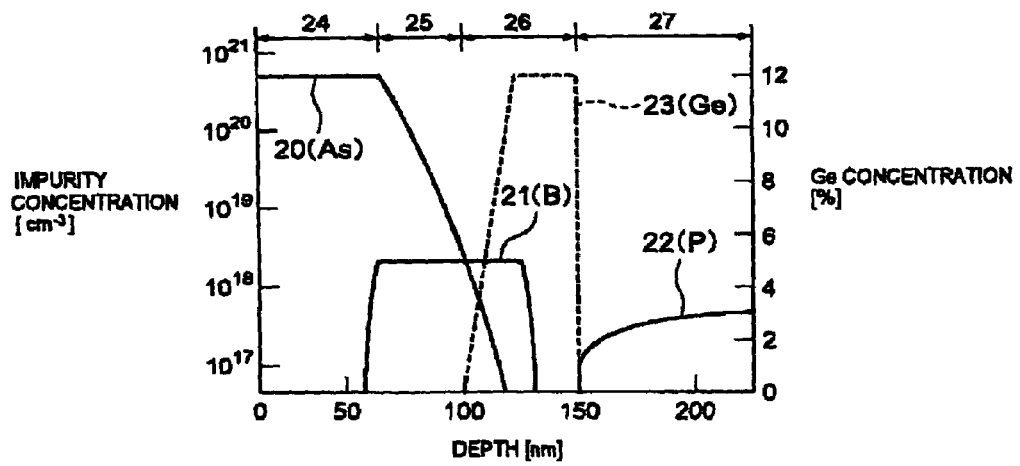
FIG. 2 is a diagram showing the distributions of the impurity concentration and the composition ratio of Ge in the depth direction of another conventional bipolar transistor.
Figure 3:
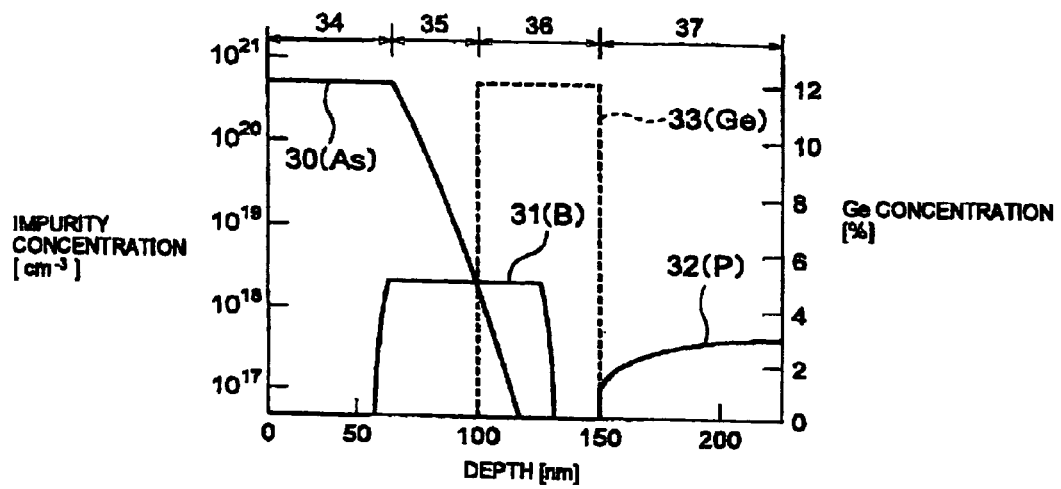
FIG. 3 is a diagram showing the distributions of the impurity concentration and the composition ratio of Ge in the depth direction of another conventional bipolar transistor.
Figure 4:
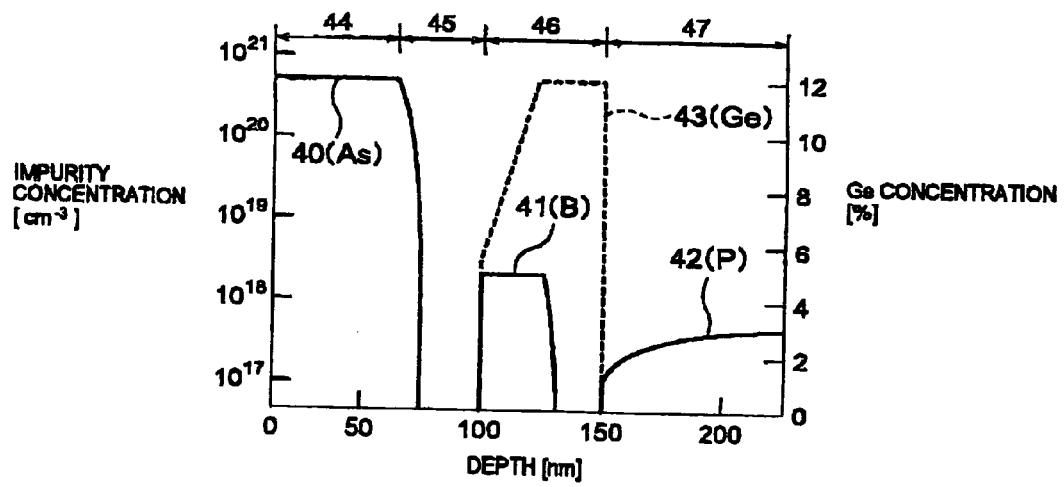
FIG. 4 is a diagram showing the distributions of the impurity concentration and the composition ratio of Ge in the depth direction of an ideal bipolar transistor including a non-doped layer between a base layer and an emitter layer.
Figure 5:
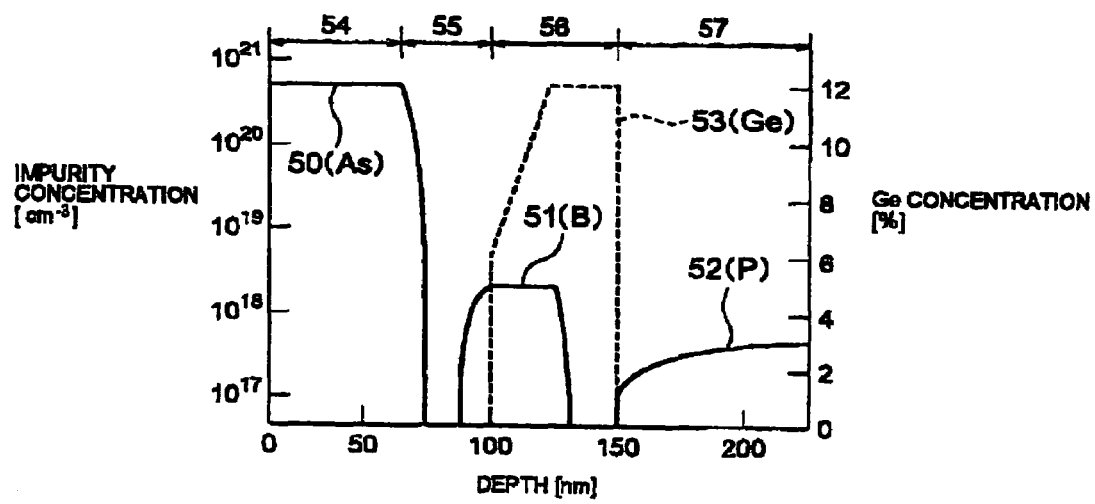
FIG. 5 is a diagram showing the distributions of the impurity concentration and the position ratio of Ge in the depth direction, for illustrating problems in manufacture of a bipolar transistor having the profile shown in FIG. 4.

Comparisons are performed between FIG. 7 and FIG. 5. As is clear from the profile shown in FIG. 7, restriction is put on the diffusion (thermal diffusion) of boron from the base region 77 toward the emitter poly-Si region 74 side. This is because the diffusion coefficient of boron in the SiGe crystal is significantly smaller than that in the Si crystal, as is well known. That is, in the present example, since the SiGe region 76 is provided, restriction is put on the diffusion of boron from the ba e region 77 toward the emitter region 74 side, and thereby, the realized profile is similar to the ideal profile shown in FIG. 4.

In FIG. 7, the composition ratio of Ge in the SiGe base region 77 gradually decreases partially in the emitter region side with increasing proximity to the emitter region side. Furthermore, the composition ratio of Ge in the non-doped SiGe region 76 is smaller than the composition ratio of Ge in the emitter region-side end of the SiGe base region 77. By these changes in the composition ratio of Ge and the above-described restriction on the thermal diffusion of boron, a small base-emitter junction capacitance $C_{BE}$ can be achieved. Since the composition ratio of Ge is adjusted at a relatively high value (6%) in the emitter region-side end of the SiGe base region 77, a high direct-current gain β can be achieved. In this manner, a small minimum noise figure can be realized with respect to the bipolar transistor having the profile shown in FIG. 7.

The band gap of the SiGe region 76 is narrower than the band gap of the region shown in FIG. 4 (the base region side of the non-doped layer 45) corresponding to this region. However, this difference in the band gap has no effect on the device characteristics, as described below.

The non-doped region is composed of the single crystal Si region 75 and the SiGe region 76, and becomes a space-charge region during operation of the device. In this space-charge region, both of the conduction-band energy and the valence-band energy significantly vary in accordance with the locations. That is, in this space-charge region, the potential relative to the electron is sharply decreased with increasing proximity the emitter region 74 side, whereas the potential relative to the hole is sharply decreased with increasing proximity to the base region 77 side. Consequently, when the band gap of this space-charge region takes on an intermediate value between the band gap of the emitter region 74 and the band gap of the base region 77, no adverse effect is exerted an the base-emitter carrier transportation.

On the other hand, if the band gap of the space-charge region is wider than that of the emitter region 74, or is narrower than that of the base region 77, a potential barrier may be generated in the conduction band and may interfere the electron transportation, and the potential barrier to the hole may be reduced in the valence band. As a result, adverse effects are exerted an the direct-current gain β and an effective base-emitter junction capacitance $C_{BE}$. In the bipolar transistor having the profile shown in FIG. 7, the band gap of the SiGe region 76 takes on an intermediate value between that of the base region 77 and that of the emitter region 74 and the single crystal Si region 75, and in addition, the composition ratio of Ge continuously varies from 0% to 6% with increasing proximity to the base region 77. Therefore, the bipolar transistor corresponding to FIG. 7 can have substantially the sane carrier transportation characteristic, that is, the minimum noise figure, as that of the bipolar transistor corresponding to FIG. 4.

Figure 8:
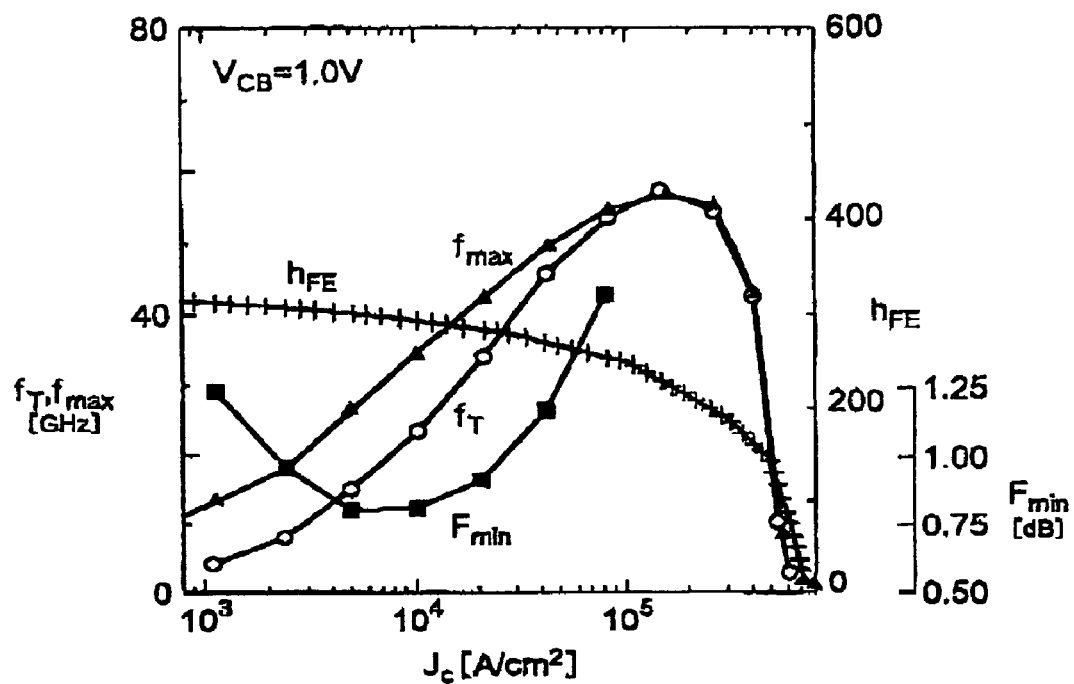
FIG. 8 is a diagram showing the result of the device simulation with respect to the bipolar transistor shown in FIG. 6.
Figure 9:
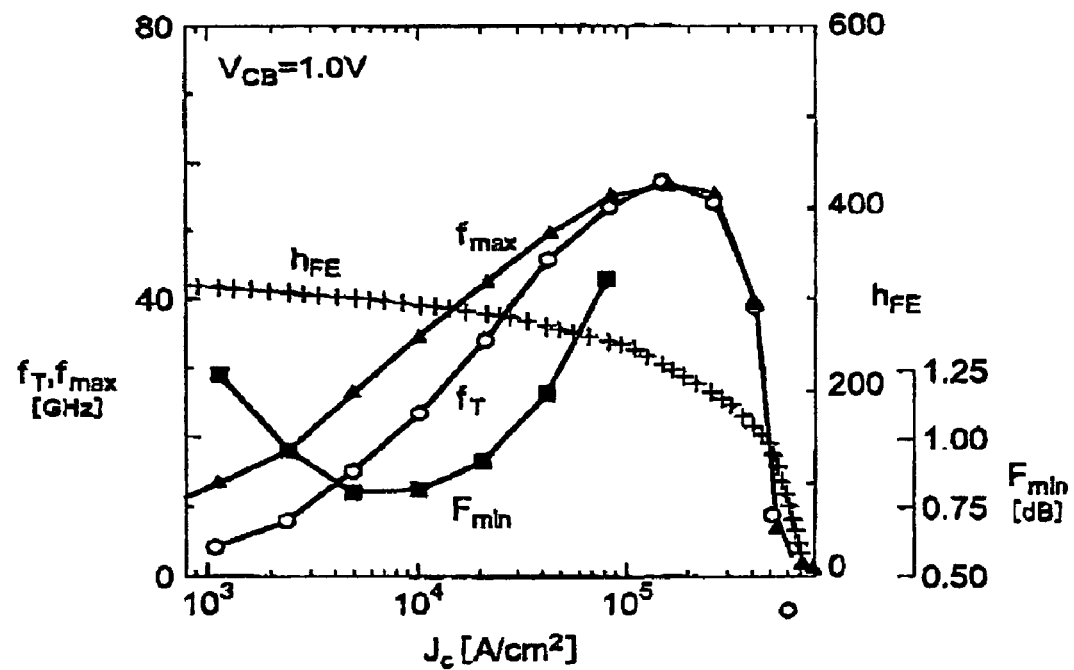
FIG. 9 is a diagram showing the result of the device simulation with respect to a conventional bipolar transistor having an ideal structure.

In order to verify the above description, simulations were performed to determine the device characteristics of the bipolar transistors corresponding to FIG. 7 and FIG. 4. FIG. 8 shows the characteristics of the bipolar transistor having the profile shown in FIG. 7, while the characteristics were determined by a device simulation. FIG. 9 shows the characteristics of the bipolar transistor having the ideal profile shown in FIG. 4, while the characteristics were determined by a device simulation. In each of FIGS. 8 and 9, the horizontal axis indicates the collector current density $J_c$, the left vertical axis indicates the cutoff frequency $f_T$ and the maximum oscillation frequency $f_{max}$, and the right vertical axis indicates the current gain $h_{FE}$ and the minimum noise figure $F_{min}$. As is clear from a comparison of FIG. 8 and FIG. 9, these characteristics are substantially the same. That is, as is clear from FIGS. 8 and 9, the bipolar transistor having the profile shown in FIG. 7 has substantially the same characteristics as that of the bipolar transistor having the ideal profile shown in FIG. 4.

Next, typical examples of the present invention will be described with reference to the drawings. A bipolar transistor in each example is assumed to have the structure shown in FIG. 6.

EXAMPLE 1

Figure 10:
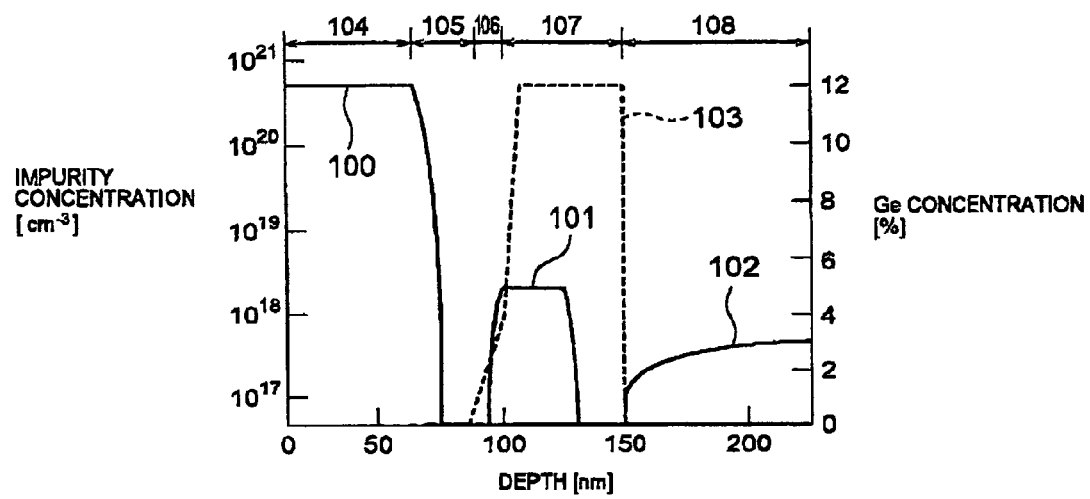
FIG. 10 is a diagram showing the distributions of the impurity concentration and the composition ratio of Ge in the depth direction of a bipolar transistor according to a first example of the present invention.

A bipolar transistor according to a first example of the present invention will be described with reference to FIG. 10. FIG. 10 shows the distributions of the impurity concentration and the composition ratio of Ge in the depth direction of the bipolar transistor according to the first example. In FIG. 10, a first solid line 100 indicates a concentration of arsenic, while arsenic is a dopant in an n-type emitter. A second solid line 101 indicates a concentration of boron, while boron is a dopant in a p-type base. A third solid line 102 indicates a concentration of phosphorus, while phosphorus is a dopant in an n-type collector. A broken line 103 indicates a composition ratio of Ge. A first double-headed arrow 104 indicates an emitter poly-Si region. A second double-headed arrow 105 indicates a single crystal Si region (non-doped Si region). The single crystal Si region is non-doped in an As-depo state, and finally a part thereof becomes of the n-type because of diffusion of arsenic from the emitter poly-Si region 104. A third double-headed arrow 106 indicates a SiGe region (non-doped SiGe region). The SiGe region is non-doped in an As-depo state, and finally a part thereof becomes of the p-type because of diffusion of boron from the base region. A fourth double-headed arrow 107 indicates a SiGe base region. A fifth double-headed arrow 108 indicates a single crystal Si region to serve as a collector.

With respect to this bipolar transistor, the base-emitter junction capacitance $C_{BE}$ is reduced because the composition ratio of Ge in the base region 107 is decreased with increasing proximity to the emitter region side, and the non-doped layers 105 and 106 are provided between the emitter region and the base region. In addition, the direct-current gain β is improved because the composition ratio of Ge is adjusted to be 4% in the emitter region-side end of the base region 107. The minimum noise figure is reduced by the reduction in the base-emitter junction capacitance $C_{BE}$ and the improvement of the direct-current gain β. Since the non-doped SiGe layer 106 is provided, restriction is put on the diffusion of boron from the base side toward the emitter side due to heat history. Since the composition ratio of Ge in the non-doped SiGe layer 106 is made smaller than that in the emitter region-side end of the base region 107, reduction can be achieved with respect to degradation of characteristics due to generation of a potential barrier.

In the present example, the composition ratio of Ge is adjusted to be 4% in the emitter region-side end of the base region 107. However, according to other experiments carried out by the inventors of the present invention, the composition ratio of Ge in the emitter region-side end of the base region 107 is essentially required to be 3% or more, or be more than or equal to one-fifth the maximum value of the composition ratio of Ge in the base region 107.

According to other experiments worried out by the inventors of the present invention, desirably, the total film thickness is within the range of 5 nm or more, but 60 nm or less with respect to the non-doped SiGe layer and the non-doped Si layer. If the total film thickness of the non-doped layers is smaller than this, impurities are applied to the base layer by doping and diffuse toward the emitter side due to heat history during manufacture of the device. If the total film thickness of the non-doped layers is larger than this, the direct-current gain β is reduced by a large degree.

EXAMPLE 2

Figure 11:
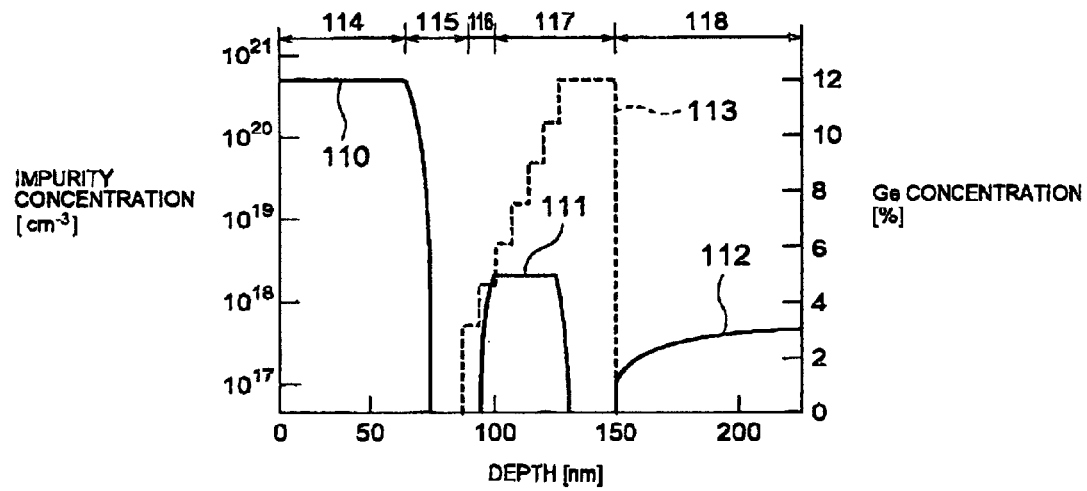
FIG. 11 is a diagram showing the distributions of the impurity concentration and the composition ratio of Ge in the depth direction of a bipolar transistor according to a second example of the present invention.

A bipolar transistor according to a second example of the present invention will be described with reference to FIG. 11. FIG. 11 shows the distributions of the impurity concentration and the composition ratio of Ge in the depth direction of the bipolar transistor according to the second example. In FIG. 11, a first solid line 110 indicates a concentration of arsenic, while arsenic is a dopant in an n-type emitter. A second solid line 111 indicates a concentration of boron, while boron is a dopant in a p-type base. A third solid line 112 indicates a concentration of phosphorus, while phosphorus in a dopant in an n-type collector. A broken line 113 indicates a composition ratio of Ge. A first double-headed arrow 114 indicates an emitter poly-Si region. A second double-headed arrow 115 indicates a single crystal Si region (non-doped Si region). The single crystal Si region is non-doped in an As-depo state, and finally a part thereof becomes of the n-type because of diffusion of arsenic from the emitter poly-Si region 114. A third double-headed arrow 116 indicates a SiGe region (non-doe SiGe region). The SiGe region is non-doped in an As-depo state, and finally a part thereof becomes of the p-type because of diffusion of boron from the base region. A fourth double-headed arrow 117 indicates a SiGe base region. A fifth double-headed arrow 118 indicates a single crystal Si region to serve as a collector.

With respect to this bipolar transistor, the base-emitter junction capacitance $C_{BE}$ is reduced because the composition ratio of Ge in the base region 117 is stepwise decreased with increasing proximity to the emitter region side, and the non-doped layers 115 and 116 are provided between the emitter region 114 and the base region 117. In addition, the direct-current gain β is improved because the composition ratio of Ge is adjusted to be a high 6% in the emitter region-side end of the base region 117. The minimum noise figure is reduced by the reduction in the base-emitter junction capacitance $C_{BE}$ and the improvement in the direct-current gain β. Since the non-doped SiGe layer 116 is provided, restriction is put on the diffusion of boron toward the emitter region side due to heat history. Since the composition ratio of Ge in the non-doped SiGe region 116 in made smaller than that in the emitter region-side end of the base region 117, reduction can be achieved with respect to degradation of characteristics due to generation of a potential barrier. Since the composition ratio of Ge is stepwise changed, this bipolar transistor has advantages in case of manufacture and the possibility of reducing variations in the manufacture.

EXAMPLE 3

Figure 12:
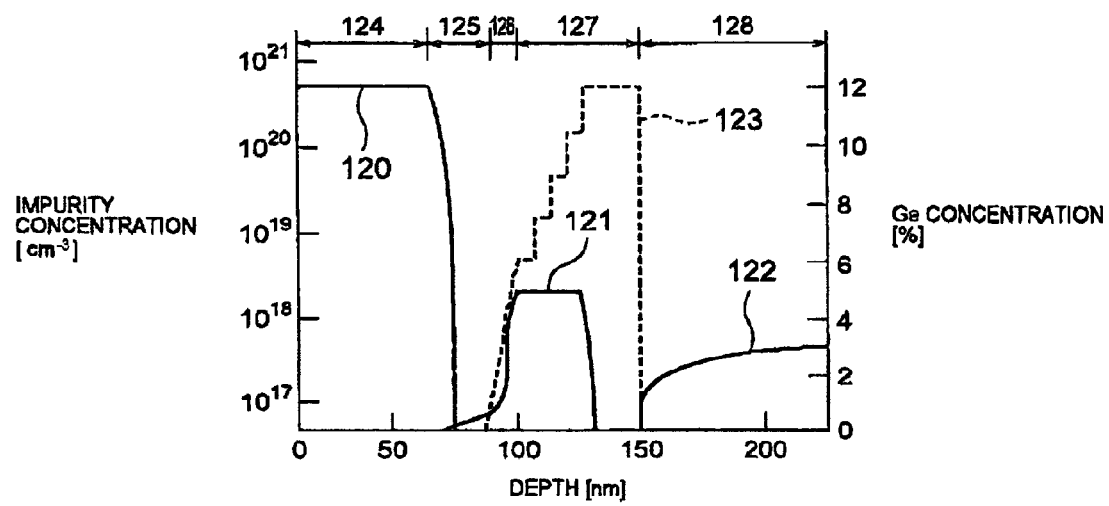
FIG. 12 is a diagram showing the distributions of the impurity concentration and the composition ratio of Ge in the depth direction of a bipolar transistor according to a third example of the present invention.

A bipolar transistor according to a third example of the present invention will be described with reference to FIG. 12. FIG. 12 shows the distributions of the impurity concentration and the composition ratio of Ge in the depth direction of the bipolar transistor according to the third example. In FIG. 12, a first solid line 120 indicates a concentration of arsenic, while arsenic is a dopant in an n-type emitter. A second solid line 121 indicates a concentration of boron, while boron is a dopant in a p-type base. A third solid line 122 indicates a concentration of phosphorus, while phosphorus is a dopant in an n-type collector. A broken line 123 indicates a composition ratio of Ge. A first double-headed arrow 124 indicates an emitter poly-Si region. A second double-headed arrow 125 indicates a single crystal Si region (a region assumed to be a non-doped Si region). The single crystal Si region is of the p-type having a low impurity concentration in an As-depo state, and finally a part thereof becomes of the n-type because of diffusion of arsenic from the emitter poly-Si region 124. A third double-headed arrow 126 indicates a p-type SiGe region having a low impurity concentration (a region assumed to be a non-doped SiGe layer). A fourth double-headed arrow 75 indicates a SiGe base region. A fifth double-headed arrow 76 indicates a single crystal Si region to serve as a collector.

In actual manufacture of the device, a dopant (gas) is used for deposition with respect to the base region 127, and may remain thereafter in a growth chamber. In such a case, the dopant remaining in the growth chamber is taken into the non-doped SiGe layer 126 and the non-doped Si layer 125 during deposition of these layers. As a result, the distribution of the impurity concentration becomes as shown in FIG. 12. However, according to verification based on other experiments carried out by the inventors of the present invention, these layers perform the function similar to that of the non-doped layer when the impurity concentration thereof is $1 \times 10^{17}$ cm$^{-3}$ or less, or is less than or equal to one-fiftieth the impurity concentration of the base region 127.

With respect to this bipolar transistor, the base-emitter junction capacitance $C_{BE}$ is reduced because the composition ratio of Ge in the base region 127 is stepwise decreased with increasing proximity to the emitter region side, and the p-type layers 125 and 126 having a very low impurity concentration (assumed to be non-doped layers) are provided between the emitter region 124 and the base region 127. In addition, the direct-current gain β is improved because the composition ratio of Ge is adjusted to be a high 6% in the emitter region-side end of the base region 127. The minimum noise figure is reduced by the reduction in the base-emitter junction capacitance $C_{BE}$ and the improvement in the direct-current gain β. Since the SiGe layer 126 is provided to have a low p-type impurity concentration, restriction is put on the diffusion of boron from the base region 127 toward the emitter region side due to heat history. Since the composition ratio of Ge in the SiGe region 126 having a low p-type impurity concentration is mode smaller than that in the emitter region-side end of the base region 127, reduction can be achieved with respect to degradation of characteristics due to generation of a potential barrier.

With respect to the bipolar transistor of the present example, since the composition ratio of Ge is stepwise changed in the base region 127, the device is easily manufactured and variations are reduced in the manufacture. Although the composition ratio of Ge in continuously changed in the SiGe region 126 having a low p-type impurity concentration, since this region 126 is included in the space-charge region during operation of the device, precise control is not required with respect to the composition profile of Ge in this region. Consequently, advantages are brought about by stepwise change of the composition ratio of Ge in the base region 127, and the advantages are not impaired. When the composition ratio of Ge in this region 126 is continuously changed, advantages are brought about in restriction of the diffusion of boron because of maximization of the composition ratio of Ge in the base region side, as well as in restriction of the generation of a potential barrier.

EXAMPLE 4

Figure 13:
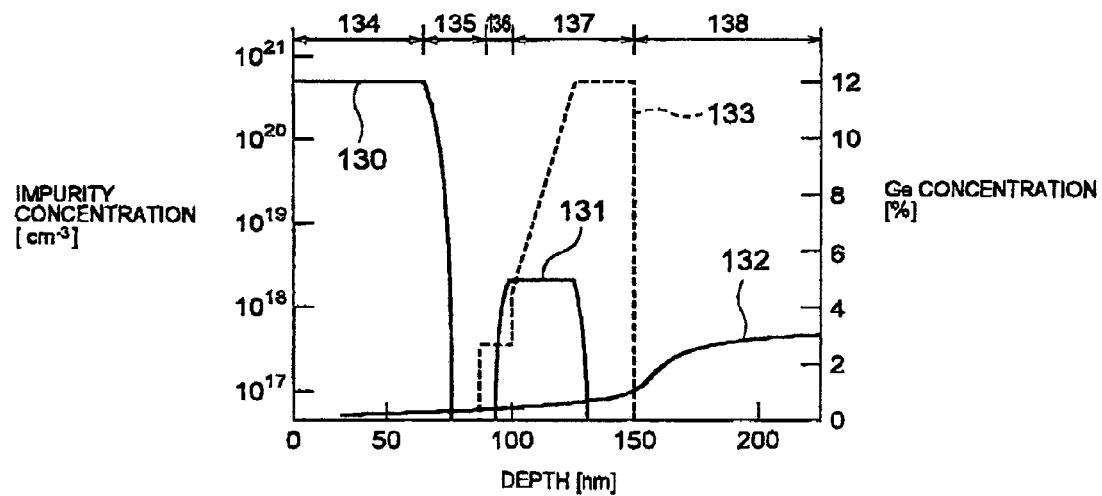
FIG. 13 is a diagram showing the distributions of the impurity concentration and the composition ratio of Ge in the depth direction of a bipolar transistor according to a fourth example of the present invention.

A bipolar transistor according to a fourth example of the present invention will be described with reference to FIG. 13. FIG. 13 shows the distributions of the impurity concentration and the composition ratio of Ge in the depth direction of the bipolar transistor according to the fourth example. In FIG. 13, a first solid line 130 indicates a concentration of arsenic, while arsenic is a dopant in an n-type emitter. A second solid line 131 indicates a concentration of boron, while boron is a dopant in a p-type base. A third solid line 132 indicates a concentration of phosphorus, while phosphorus in a dopant in an n-type collector. A broken line 133 indicates a composition ratio of Ge. A first double-headed arrow 134 indicates an emitter poly-Si region. A second double-headed arrow 135 indicates a single crystal Si region (a region assumed to be a non-doped Si region). The single crystal Si region is non-doped in an As-depo state, and finally becomes of the n-type because of diffusion of arsenic from the emitter poly-Si region 134 and application of the phosphorus ion by doping during formation of the collector. A third double-headed arrow 136 indicates a SiGe region (a region assumed to be a non-doped SiGe region). The SiGe region is non-doped in an As-depo state, and finally becomes of the n-type because of application of the phosphorus ion by doping during formation of the collector. A fourth double-headed arrow 137 indicates a SiGe base region. A fifth double-headed arrow 138 indicates a single crystal Si region to serve as a collector.

The Si region 135 and the SiGe region 136 are formed as non-doped regions, and may become the n-type having a low concentration due to doping of the collector region 138 with the phosphorus ion. In this case, the distribution of the impurity concentration thereof becomes as shown in FIG. 13. However, the impurity concentrations of these regions 135 and 136 are in the order of a low one-hundredth the impurity concentration of the base region, as shown in FIG. 13, and thereby, these regions 133 and 136 substantially perform the function as the non-doped regions.

With respect to the bipolar transistor of the present example, the base-emitter junction capacitance $C_{BE}$ is reduced because the composition ratio of Ge in the base region 137 is decreased with increasing proximity to the emitter region side, and the n-type regions 135 and 136 having very low impurity concentrations are provided between the emitter region 134 and the base region 137. In addition, the direct-current gain β is improved because the composition ratio of Ge is adjusted to be a high 4.7% in the emitter region-side end of the base region 137. The minimum noise figure is reduced by the reduction in the base-emitter junction capacitance $C_{BE}$ and the improvement in the direct-current gain β. Since the SiGe layer 136 is provided to have a low n-type impurity concentration, restriction is put on the diffusion of boron from the base region 137 toward the emitter region side due to heat history.

Since the composition ratio of Ge in the SiGe region 136 having a low n-type impurity concentration is made smaller than that in the emitter region-side end of the base region 137, reduction can be achieved with respect to degradation of characteristics due to generation of a potential barrier.

With respect to the bipolar transistor according to the present example, since the composition ratio of Ge is continuously changed in the base region 137, the device characteristics are further is improved. On the other hand, with respect to this bipolar transistor, since the composition ratio of Ge is adjusted to be a constant in the region having no effect on the device characteristics, that is, the SiGe region 136 having a low a-type impurity concentration, simplification of the device structure is achieved.

INDUSTRIAL APPLICABILITY

According to the present invention, since the non-doped SiGe region and the non-doped Si region are provided between the base region and the emitter region of the SiGe-base bipolar transistor, the minimum noise figure can be reduced.

The invention claimed is:
1. A bipolar transistor comprising:
a laminated structure comprising:
   a collector layer;
   a SiGe base layer;
   a non-doped SiGe layer;
   a non-doped SiGe layer; and
   an n-type emitter layer, in that order,
wherein a composition ratio of Ge gradually decreases with increasing proximity to an emitter layer side in at least a part of an emitter layer side of the SiGe base layer, and a composition ratio of Ge in the non-doped SiGe layer is smaller than a composition ratio of Ge at an emitter-side end of the SiGe base layer.

2. A bipolar transistor comprising:
a laminated structure comprising:
   a collector layer;
   a SiGe base layer;
   a non-doped SiGe layer;
   a non-doped Si layer; and
   an n-type emitter layer, in that order,
wherein a composition ratio of Ge stepwise deceases with increasing proximity to an emitter layer side in at least a part of an emitter layer side of the SiGe base layer, and a composition ratio of Ge in the non-doped SiGe layer is smaller than a composition ratio of Ge at an emitter layer-side end of the SiGe base layer.

3. The bipolar transistor according to claim 1, wherein a total film thickness is 5 nm or more, but 60 nm or less with respect to the non-doped SiGe layer and the non-doped Si layer.

4. The bipolar transistor according to claim 1, wherein the composition ratio of Ge is 3% or more at the emitter layer-side end of the SiGe base layer.

5. The bipolar transistor according to claim 4, wherein the composition ratio of Ge is 6% or more at the emitter layer-side end of the SiGe base layer.

6. The bipolar transistor according to claim 1, wherein the composition ratio of Ge at the emitter layer-side end of the SiGe base layer is more than or equal to one-fifth of a maximum value of the composition ratio of Ge in the SiGe base layer.

7. The bipolar transistor according to claim 1, wherein the non-doped SiGe layer and the non-doped Si layer comprise a layer having an impurity concentration of $1 \times 10^{17}$ cm$^{-3}$ or less.

8. The bipolar transistor according to claim 1, wherein the non-doped SiGe layer and the non-doped Si layer comprise a layer having an impurity concentration of less than or equal to one-fiftieth the impurity concentration of the base region.

9. The bipolar transistor according to claim 1, wherein the non-doped SiGe layer and the non-doped Si layer constitute a space-charge region, and a band gap of the space-charge region comprises a value between a band gap of the emitter layer and a band gap of the base layer.

10. The bipolar transistor according to claim 2, wherein the composition ratio of Ge continuously or stepwise decreases with increasing proximity to the emitter side in at least a part of the emitter side of the SiGe base layer.

11. The bipolar transistor according to claim 2, wherein a total film thickness is 5 nm or more, but 60 nm or less with respect to the non-doped SiGe layer and the non-doped Si layer.

12. The bipolar transistor according to claim 2, wherein the composition ratio of Ge is 3% or more at the emitter layer-side end of the SiGe base layer.

13. The bipolar transistor according to claim 2, wherein the composition ratio of Ge at the emitter layer-side end of the SiGe base layer is more than or equal to one-fifth a maximum value of the composition ratio of Ge in the SiGe base layer.

14. The bipolar transistor according to claim 2, wherein the non-doped SiGe layer and the non-doped Si layer comprise a layer having an impurity concentration of $1 \times 10^{17}$ cm$^{-3}$ or less.

15. The bipolar transistor according to claim 2, wherein the non-doped SiGe layer and the non-doped Si layer comprise a layer having an impurity concentration of less than or equal to one-fiftieth the impurity concentration of the base region.

16. The bipolar transistor according to claim 2, wherein the non-doped SiGe layer and the non-doped Si layer constitute a space-charge region, and a band gap of the space-charge region comprises a value between a band gap of the emitter layer and a band gap of the base layer.

* * * * *